United States Patent
Schloss (10) Patent No.: US 7,229,050 B2
(45) Date of Patent: Jun. 12, 2007

(54) RACEWAY SYSTEM

(75) Inventor: Rheid J. Schloss, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 129 days.

(21) Appl. No.: 10/306,132

(22) Filed: Nov. 27, 2002

(65) Prior Publication Data

US 2004/0099771 A1    May 27, 2004

(51) Int. Cl.
*F16L 3/00* (2006.01)
(52) U.S. Cl. ............... 248/49; 52/220.7; 52/731.5; 52/731.9; 211/26; 361/826
(58) Field of Classification Search .............. 248/49; 211/26; 361/826, 829; 52/731.5, 731.9, 52/220.7, 242, 481.1, 481.2; 379/327; 174/72 A, 174/72 R; 312/223.1, 223, 223.6
See application file for complete search history.

(56) References Cited

U.S. PATENT DOCUMENTS

| | | | | |
|---|---|---|---|---|
| 2,191,637 | A * | 2/1940 | Wier ........................ 361/829 |
| 2,363,327 | A * | 11/1944 | Hodgkins et al. ........... 361/826 |
| 3,403,220 | A * | 9/1968 | Riedel et al. ............... 174/101 |
| 3,657,608 | A * | 4/1972 | Leone et al. ................ 361/829 |
| 3,855,427 | A * | 12/1974 | Sinden ........................ 361/827 |
| 4,002,856 | A * | 1/1977 | Sedlacek et al. ............ 379/327 |
| 4,553,674 | A * | 11/1985 | Yoshikawa et al. ........... 211/26 |
| 4,715,502 | A * | 12/1987 | Salmon ........................ 211/26 |
| 4,887,187 | A * | 12/1989 | Nickola ...................... 361/664 |
| 4,907,767 | A * | 3/1990 | Corsi et al. .................... 248/49 |
| D308,061 | S * | 5/1990 | De Luca .................... D14/240 |
| 5,023,404 | A * | 6/1991 | Hudson et al. ............... 174/97 |
| 5,326,934 | A * | 7/1994 | LeMaster et al. ............. 174/59 |
| 5,584,406 | A * | 12/1996 | Besserer et al. ............ 211/189 |
| 5,586,012 | A * | 12/1996 | Lerman ..................... 361/826 |
| 5,639,048 | A | 6/1997 | Bartholomew et al. |
| 5,765,786 | A | 6/1998 | Gretz |
| 5,867,372 | A * | 2/1999 | Shie .......................... 361/826 |
| 5,899,545 | A * | 5/1999 | Besserer et al. ......... 312/257.1 |
| 5,954,301 | A | 9/1999 | Joseph et al. |
| 5,992,802 | A | 11/1999 | Campbell |
| 6,006,925 | A * | 12/1999 | Sevier ......................... 211/26 |
| 6,019,323 | A | 2/2000 | Jette |
| 6,076,779 | A | 6/2000 | Johnson |
| 6,129,316 | A | 10/2000 | Bauer |
| 6,138,961 | A | 10/2000 | Zweig |
| 6,170,784 | B1 | 1/2001 | MacDonald et al. |
| 6,198,047 | B1 | 3/2001 | Barr |
| 6,199,705 | B1 * | 3/2001 | Portner ....................... 211/26 |
| 6,202,860 | B1 * | 3/2001 | Ludwig ....................... 211/26 |
| 6,206,494 | B1 * | 3/2001 | Benner et al. ........... 312/265.4 |
| 6,216,320 | B1 | 4/2001 | Schauermann |

(Continued)

OTHER PUBLICATIONS

Edgelink STS/T3 SONET Transmultiplexer Manual, Telco Systems, A division of World Access, Mar. 27, 2000, 73 pages, Telco Systems, Inc., Norwood, Massachusetts.

*Primary Examiner*—Korie Chan (57) ABSTRACT

A component support system includes a first vertical support unit, a second vertical support unit and a raceway system between the first vertical support unit and the second vertical support unit. The raceway system includes at least one floor and at least one divider coupled to the at least one floor and extending non-parallel relative to the at least one floor.

62 Claims, 7 Drawing Sheets

U.S. PATENT DOCUMENTS

| | | |
|---|---|---|
| 6,310,294 B1 | 10/2001 | Di Girolamo et al. |
| 6,315,249 B1 | 11/2001 | Jensen et al. |
| 6,318,680 B1 * | 11/2001 | Benedict et al. ............... 248/49 |
| 6,321,917 B1 | 11/2001 | Mendoza |
| 6,338,413 B1 * | 1/2002 | Walter et al. ................. 211/26 |
| 6,340,141 B1 | 1/2002 | Rinderer |
| 6,347,714 B1 * | 2/2002 | Fournier et al. .............. 211/26 |
| 6,349,837 B1 * | 2/2002 | Serban ........................ 211/26 |
| 6,354,542 B1 | 3/2002 | Meyer et al. |
| 6,394,398 B1 | 5/2002 | Reed et al. |
| 6,504,094 B2 * | 1/2003 | Woo et al. ..................... 174/50 |
| 6,516,954 B2 * | 2/2003 | Broome ....................... 211/26 |
| 6,543,626 B1 * | 4/2003 | Mendoza ..................... 211/26 |
| 6,561,602 B1 * | 5/2003 | Sevier et al. ............ 312/265.1 |

\* cited by examiner

RACEWAY SYSTEM

BACKGROUND OF THE INVENTION

Computing systems, such as those used in communication systems and networks, typically include a plurality of hardware elements or computing components such as servers, routers, switches and the like. Due to space limitations, such components are usually vertically stacked or supported in a vertical support unit such as a cabinet, shelving system, closet or rack.

Computing components typically require at least two connections: data and power. Data connections provide data input to the component and output data from the component. Power connections provide necessary power to the component. Such data and power is transmitted by cabling (also known as wiring). In some environments, the power and data cabling are routed from the floor or ceiling through a single channel extending along one side of the vertical support unit. In other environments, the power and data cabling are simply strung and attached along the vertical support unit.

SUMMARY OF THE INVENTION

According to one embodiment of the present invention, a raceway system includes at least one floor having a first longitudinal length, a first rail extending from the at least one floor, a second rail extending from the at least one floor and at least one substantially imperforate divider extending between the first rail and the second rail. The divider has a second longitudinal length no less than the first longitudinal length.

According to another embodiment, a raceway system includes a first floor, a first rail extending from the first floor, a second floor, a second rail extending from the second floor and at least one substantially imperforate divider coupled to at least one of the first floor and the second floor and extending between the first rail and the second rail. The first floor and the second floor are removably coupled to one another.

According to another embodiment, a component support system includes a first vertical support unit, a second vertical support unit and a raceway system between the first rack and the second rack. The raceway system includes at least one floor and at least one divider coupled to the at least one floor and extending non-parallel relative to the at least one floor.

According to another embodiment, a component support system includes a first vertical support unit, a second vertical support unit, means for providing at least two cable receiving channels between the first vertical support unit and the second vertical support unit and means for preventing electromagnetic interference passing between the at least two cable receiving channels.

According to another embodiment, a component cabling system includes a first vertical support unit, at least one first computing component supported by the first vertical support unit, a second vertical support unit, at least one second computing component supported by the second vertical support unit, a raceway system between the first vertical support unit and the second vertical support unit, at least one communication cabling and at least one power cabling. The raceway system is configured to provide a plurality of channels separated by at least one divider. The plurality of channels includes a first channel and a second channel. The at least one communication cabling extends in the first channel and is coupled to at least one first computing component. The at least one power cabling extends in the second channel and is coupled to the at least one second computing component.

According to another embodiment, a raceway system includes at least one floor, a first rail extending from the at least one floor, a second rail extending from the at least one floor and at least one substantially imperforate divider extending between the first rail and the second rail. At least one of the first rail and the second rail includes at least one opening configured to permit passage of at least one of a communication cabling or a power cabling therethrough.

According to another embodiment, a raceway add-on for use with a raceway having at least one first floor, a first rail extending from the at least one first floor and a second rail extending from the at least one first floor is provided. The raceway add-on includes a second floor and a third rail extending from the second floor. The add-on is configured to be releasably coupled to the raceway to form a raceway system having two side-by-side channels configured to separate cabling in the first and second channels.

DETAILED DESCRIPTION OF THE PREFERRED EMBODIMENTS

Figure 1:
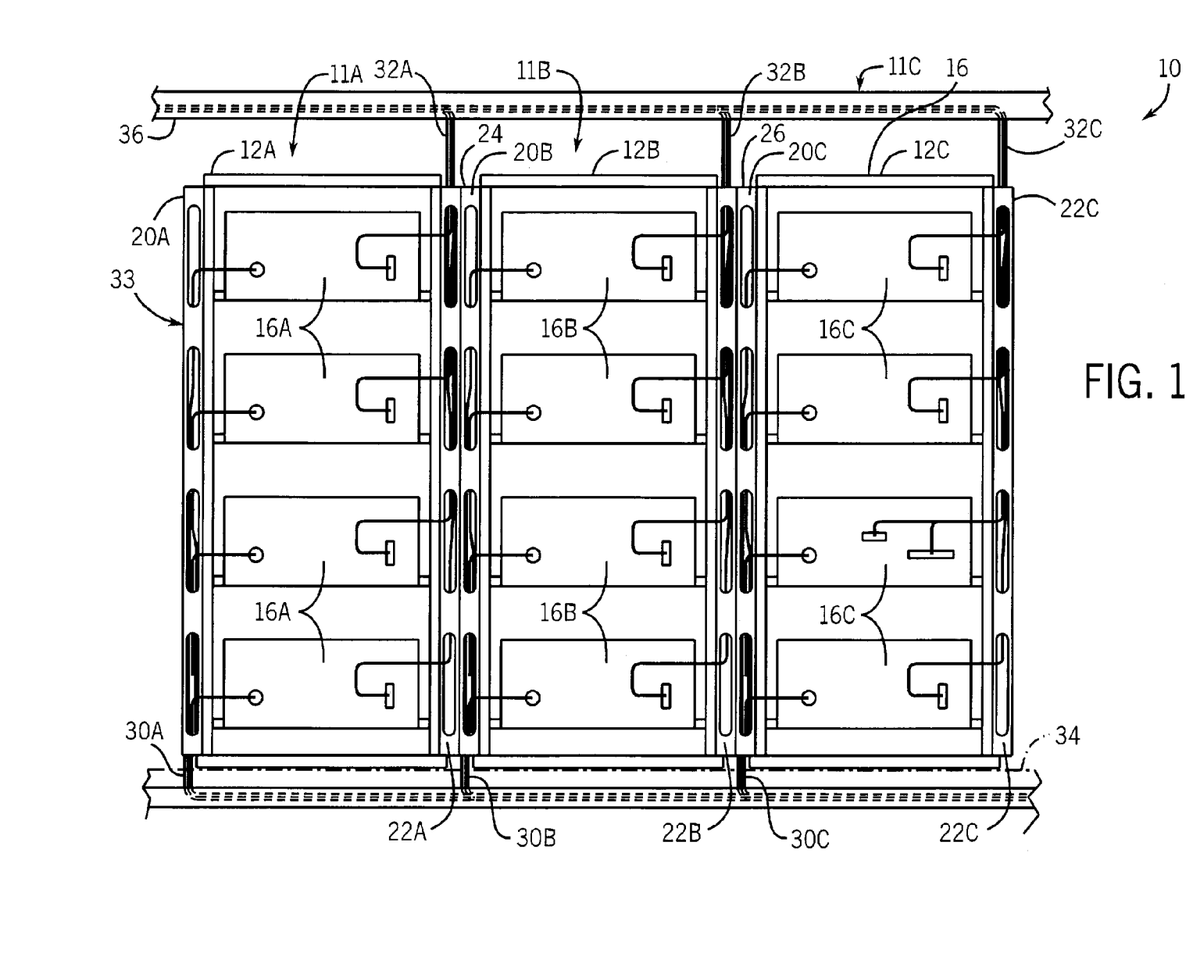
FIG. 1 is a rear elevational view schematically illustrating an exemplary embodiment of a component cabling system.

FIG. 1 is a front perspective view schematically illustrating component cabling system 10. Component cabling system 10 supports a plurality of computing components enabling the components to be connected to power and data input/output via wiring or cabling. System 10 generally includes a plurality of subsystems 11A, 11B, 11C which include vertical support units 12A, 12B, 12C, components 16A, 16B, 16C, raceways 20A, 20B, 20C, power cabling 30A, 30B, 30C and data or communication cabling 32A, 32B, 32C, respectively. Vertical support units 12A, 12B, 12C and raceways 20A, 20B, 20C provide a component support system 33 adapted to contain, support and organize components 16A, 16B, 16C and cabling 30A, 30B, 30C, 32A, 32B, 32C. Vertical support units 12A, 12B, 12C generally comprise structures configured to support a plurality of computing or network components in a vertically stacked or arranged relationship. In the particular embodiment illustrated, units 12A, 12B, 12C comprise generally open racks configured to rest upon floor 34. In alternative embodiments, units 12A, 12B and 12C may alternatively be configured to be suspended from structures such as ceiling 36.

Although illustrated as comprising racks, vertical support units 12A, 12B, 12C may alternatively comprise other structures capable of vertically supporting components 16A, 16B, 16C such as closets, cabinets, shelving systems and the like. Although units 12A, 12B, 12C are illustrated as being substantially identical to one another, units 12A, 12B, 12C may alternatively be configured to support different and varying components 16A, 16B, 16C as well as different numbers of components 16A, 16B, 16C.

Components 16A, 16B, 16C generally comprise one of a variety of conventionally known or future developed computing or communication components or hardware. Components 16A, 16B, 16C are supported in a vertically stacked arrangement by vertical support units 12A, 12B and 12C, respectively. Components 16A, 16B, 16C receive power by a power cabling 30A, 30B and 30C, respectively. Components 16A, 16B, 16C further receive and transmit data via cabling 32A, 32B and 32C, respectively. Examples of components 16A, 16B, 16C include routers, servers, switches, computer drives and the like. Although components 16A, 16B, 16C are illustrated as being substantially identical to one another, components 16A, 16B, 16C may alternatively comprise any of a variety of different components having different sizes, different functions and different configurations.

Raceways 20A, 20B, 20C and raceways 22A, 22B, 22C each generally comprises a structure configured to provide an elongate vertical channel configured to contain power cabling 30A, 30B, 30C and data cabling 32A, 32B, 32C, respectively. Raceways 20A, 20B, 20C and raceways 22A, 22B, 22C each includes one or more openings that are configured to enable power cabling 30A, 30B, 30C and data cabling 32A, 32B, 32C, respectively, to be connected to components 16A, 16B, 16C which are in a plurality of vertical positions between the top and bottom of units 12A, 12B and 12C, respectively. Raceways 20A, 20B, 20C and raceways 22A, 22B, 22C each are coupled to one side of unit 12. For purposes of this disclosure, the term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature.

In the particular embodiment illustrated, raceways 20A, 20B and 20C are directly and releasably coupled to one side of each of units 12A, 12B and 12C, respectively, while raceways 22A, 22B and 22C are directly and releasably coupled to the other side of each of units 12A, 12B and 12C. respectively. As a result, raceways 20A, 20B, 20C and raceways 22A, 22B and 22C may be mounted to pre-existing vertical support units or may be moved from unit to unit as necessary. Although less desirable, raceways 20A, 20B, 20C and raceways 22A, 22B and 22C may alternatively be permanently coupled to vertical support units either by permanent attachment or by being integrally formed as part of a single unitary body with vertical support units.

In the particular embodiment illustrated, raceways 20A, 20B, 20C and raceways 22A, 22B and 22C are each coupled to corners of the vertical support units 12A, 12B and 12C such that the raceways are generally closer to the back side of components 16A, 16B and 16C as compared to the front side of such components. In alternative embodiments, raceways 20A, 20B, 20C and raceways 22A, 22B and 22C may be coupled adjacent to the front corners of vertical support units 12A, 12B and 12C or may be coupled to vertical support units 16A, 16B and 16C along the uppermost horizontally extending portions of such units. Although less desirable, raceways 20A, 20B and 20C and raceways 22A, 22B and 22C may alternatively be coupled to and supported by other structures independent of units 12A, 12B and 12C.

As will be described in greater detail hereafter, raceways 20A, 20B, 20 and raceways 22A, 22B, 22C each are also configured to be releasably coupled to one another. In the embodiment illustrated, such coupling is direct and stationary in nature.

When coupled to one another, raceways 20A, 20B, 20C and 22A, 22B, 22C form a multi-channel system such as systems 24 and 26 formed by raceways 22A and 20B and raceways 22B and 20C, respectively. Although less desirable, adjacent raceways may alternatively be permanently coupled to one another such as by welding, adhesives, or permanent fasteners, or may be integrally formed with one another as part of a single unitary body such as when the adjacent raceways are formed out of a single integral unitary piece of material or materials. In those embodiments wherein multi-channel systems having raceways permanently coupled to one another are employed, the raceways utilized on the outermost sides may comprise an individual raceway such as raceways 20A or 22C or may comprise a multi-channel raceway wherein one of the channels is not occupied by cabling.

Because raceways 20A, 20B, 20C and raceways 22A, 22B, 22C are releasably coupled to one another, they may be used independent of one another such as shown on the left and right sides of units 12A and 12C, respectively, or may be joined to one another to form a multi-channel system between adjacent vertical support units. As a result, units 12A, 12B and 12C, along with their associated power cabling and data or communication cabling, may be separated from one another by detaching raceways 20B and 22A and raceways 22B and 20C which form systems 24 and 26, respectively. Consequently, subsystem 11A may be separated from subsystem 11B by simply detaching raceway 22A from raceway 20B. Such modularization of subsystems 11A, 11B and 11C greatly increases the flexibility and customization in the design of such computing or network centers. Moreover, because the raceways of the multi-channel systems 24, 26 may be separated from one another, cabling for each individual subsystem 11A, 11B and 11C may be deposited within the appropriate raceways and wired at an integration center prior to being shipped and attached to adjacent subsystems.

Power cabling 30A, 30B and 30C generally provides power to components 16A, 16B and 16C, respectively. In the particular embodiment illustrated, power cabling 30A, 30B and 30C extend along floor 34 and upward along raceways 20A, 20B and 20C, respectively. Alternatively, power cabling 30A, 30B and 30C may be provided from ceiling 36. In the particular embodiment illustrated, power cabling 30A, 30B and 30C comprise conventionally known bundles (8 pairs of 22 gauge cables). Alternatively, other conventionally known or future developed cabling may be employed.

Communication cabling 32A, 32B and 32C, also known as network or data cabling, provides communication between and to each of components 16A, 16B and 16C, respectively. In the particular embodiment illustrated, communication cabling 32A, 32B and 32C is initially provided from ceiling 36 and passes down through each of raceways 22A, 22B and 22C until parsed out for connection to the components. In the particular embodiment illustrated, communication cabling 32A, 32B and 32C comprises conventionally known communication cabling such as CAT5 cabling. Alternatively, such cabling may comprise various other conventionally known or future developed cabling that permits communication or provides data transmission. Examples of such cabling may comprise optical cables and the like.

Figure 2:
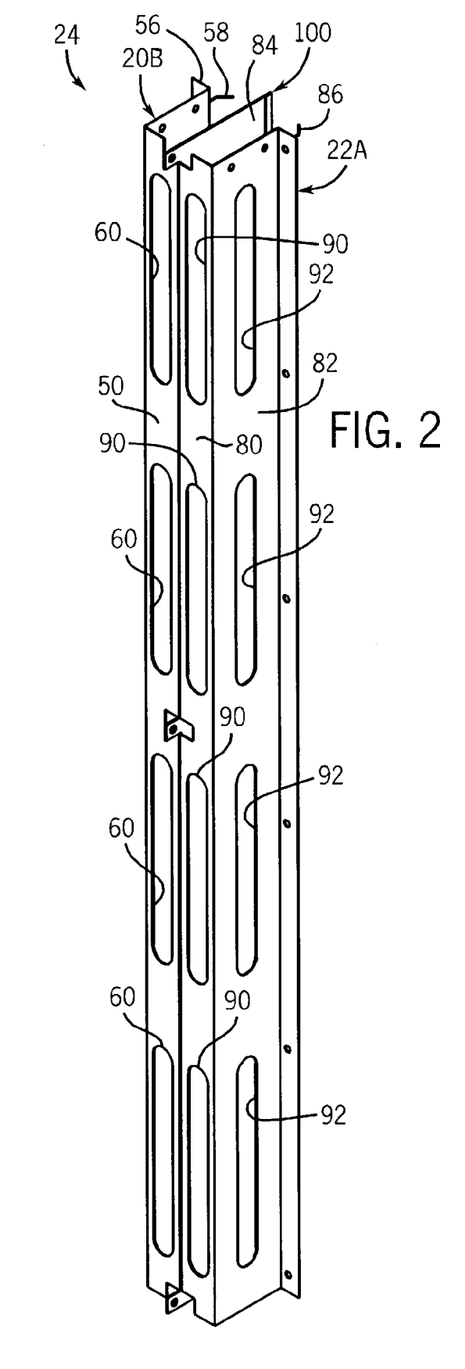
FIG. 2 is a rear perspective view of a multi-channel raceway system of the component cabling system of FIG. 1.
Figure 3:
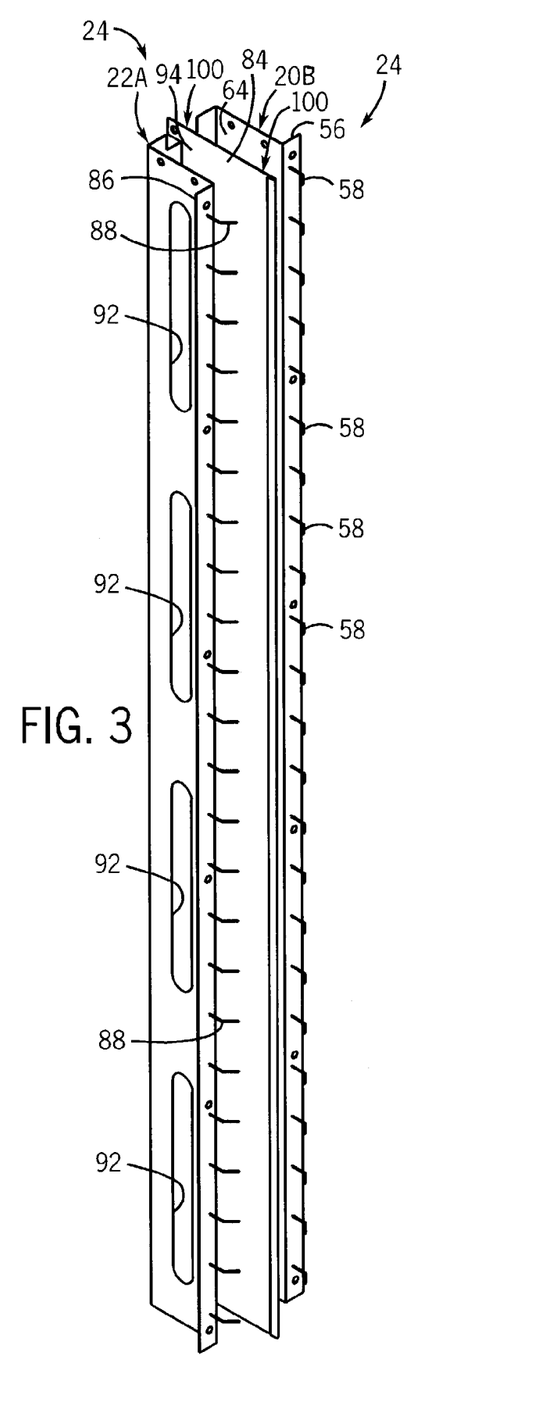
FIG. 3 is a front perspective view of the multi-channel raceway system.
Figure 4:
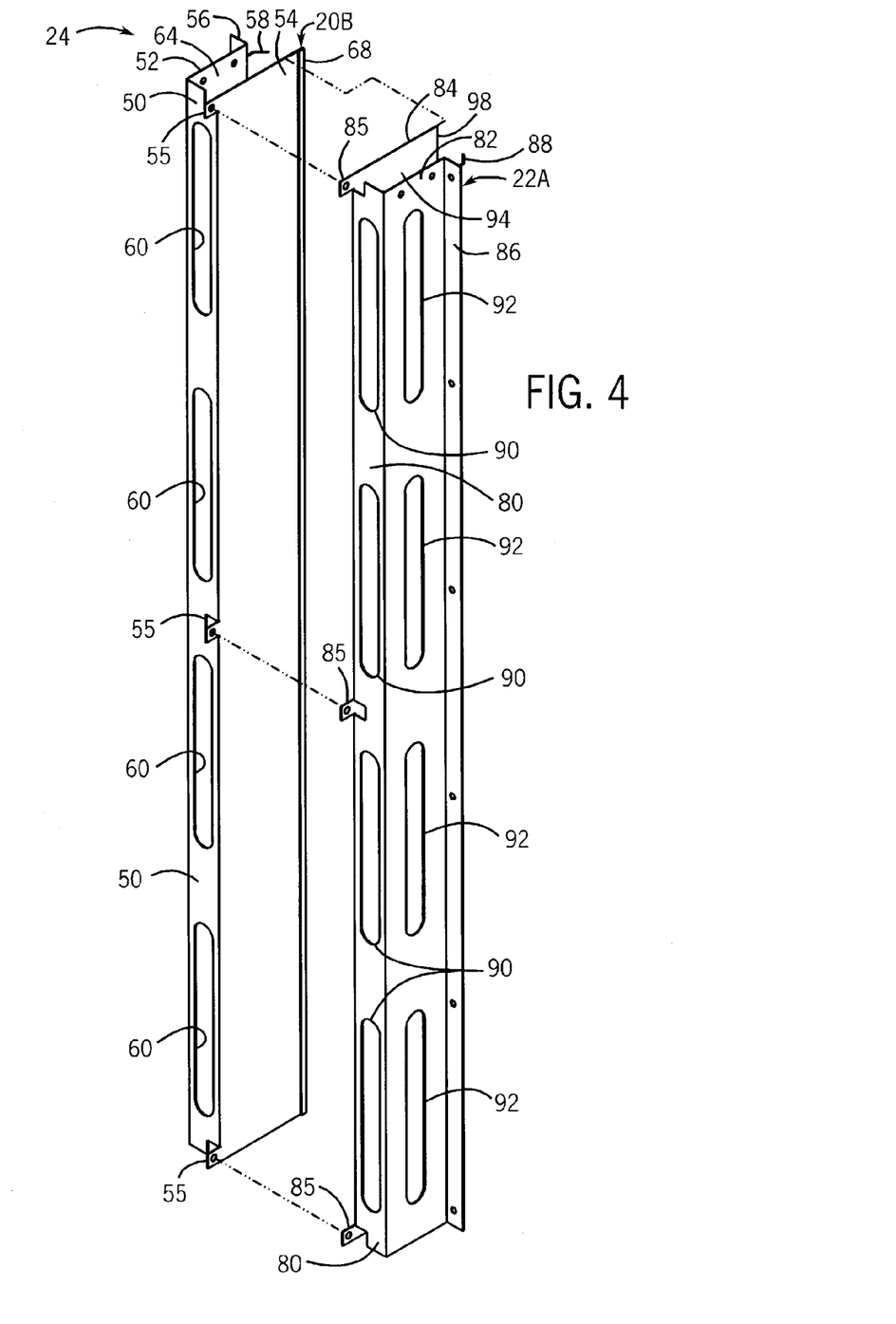
FIG. 4 is an exploded rear perspective view of the multi-channel raceway system.

FIGS. 2–4 illustrate multi-channel raceway system 24 in greater detail. Because system 26 is identical to system 24, only system 24 is described in detail. System 24 is formed by the junction of raceways 20B and 22A. Raceway 20B generally includes floor 50, rails 52, 54, flange 56, supports 58 and retainers 59. Floor 50 generally comprises the member extending between rails 52 and 54. Floor 50 includes a plurality of openings 60 extending therethrough. Openings 60 are located, sized and shaped so as to permit the passage of power cabling therethrough. Openings 60 are preferably sized, located and shaped so as to further permit the passage of the power cabling connector therethrough. For example, conventionally known power cabling typically has an end terminating at a C-13 plug. Openings 60 are preferably configured to permit passage of a C-13 plug. In the particular embodiment illustrated, each opening 60 has a transverse width of approximately 2.0 inches.

Openings 60 are situated along substantially the entire longitudinal length of raceway 20B so as to enable power cabling to extend through openings 60 and to be connected to components 16B at any one of a plurality of vertical locations or vertical heights along vertical support unit 12B. In the particular embodiment illustrated, floor 50 includes four spaced openings 60 wherein each opening has a length of approximately 18 inches.

Rail 52 generally comprises a structure extending from floor 50 opposite rail 54. Rail 52 is configured to cooperate with rail 54 to capture or contain power cabling therebetween. Rail 52 includes openings 62 (shown in FIGS. 5A–5C). Like openings 60, openings 62 are generally configured to permit the passage of power cabling therethrough. Openings 62 are also preferably configured to permit the passage of a power cabling connector, such as a C-13 plug, therethrough. In the particular embodiment illustrated, openings 62 have a transverse width of 2 inches and a longitudinal length of approximately 18 inches. In the particular embodiment illustrated, rail 52 includes four spaced openings 62 and are located along substantially the entire longitudinal length of rail 52 such that power cabling may extend through openings 62 and may be connected to components 16B located at a plurality of vertical locations along vertical support unit 12B. In the particular embodiment illustrated, openings 62 are spaced along rail 52 in a fashion nearly identical to the spacing of openings 60 along floor 50. In alternative embodiments, openings 62 may have different longitudinal lengths, as well as different transverse widths. In addition, openings 62, like openings 60, may be consolidated into a single elongate opening or different numbers of openings.

As best shown by FIGS. 2–4, rail 52 extends along the entire longitudinal length of raceway 20B. In the embodiment shown, rail 52 has a longitudinal length of approximately 74.25 inches. In alternative embodiments, rail 54 may extend only partially along the longitudinal length of raceway 20B. In yet other embodiments, rail 52 may consist of a plurality of rail portions that extend from floor 50 and that are equidistantly or non-equidistantly spaced from one another along the longitudinal length of floor 50.

Rail 54 comprises a structure extending from floor 50 opposite rail 52. Rail 54 cooperates with floor 50 and rail 52 to form an elongate channel 64. Rail 54 is spaced from rail 52 such that channel 64 has a width sufficient to contain a plurality of power cables. Channel 64 has a width sufficient to contain a bundle of eight conventionally sized power cables. In the particular embodiment illustrated, rail 54 is transversely spaced from rail 52 by a distance of approximately 2.5 inches along floor 50. In addition to being sufficiently wide, channel 64 must also be sufficiently deep. The depth of channel 64 is defined by a minimum height of either of rails 52 or 54. In the particular embodiment illustrated, rail 52 is shorter than rail 54. Rail 52 has a height of approximately 5 inches, while rail 54 has a height of approximately 7 inches. Although less desirable, rail 54 may alternatively be shorter than rail 52.

For ease of manufacture and compactness, rail 54, like rail 52, perpendicularly extends from floor 50 such that channel 64 has a generally rectangular cross section. In alternative embodiments, one or both of rails 52 or 54 may obliquely extend from floor 50 or may arcuately extend from floor 50.

Rail 54 includes coupling portion 68 which is configured to couple rail 54 and raceway 20B to raceway 22A. In the particular embodiment illustrated, coupling portion 68 is integrally formed as part of a single unitary body with rail 54 and includes a channel configured for the reception of a portion of raceway 22A. Alternatively, coupling portion 68 may be permanently or releasably attached to rail 54. Although coupling portion 68 is illustrated as providing a channel extending along substantially the entire longitudinal length of rail 54, coupling portion 68 may alternatively extend only along one or more portions of rail 54. Furthermore, in lieu of comprising a channel, coupling portion 68 may comprise other structures or mechanisms configured for releasably connecting or coupling rail 54 to raceway 22A.

Retainers 55 generally comprise tabs extending from floor 50 and configured to be connected to corresponding tabs of raceway 22A. Retainers 55 cooperate with coupling portion 68 of rail 54 to releasably couple raceways 20B and 22A together to form system 24. In the particular embodiment illustrated, retainers 55 are formed by cutting out portions of floor 50 and bending portions of floor 50. In alternative embodiments, depending upon the configuration of either coupling portions 68 or retainers 55, one of coupling portion 68 and retainers 55 may be omitted. Because retainers 55 are formed by cutting and deforming a portion of floor 50, raceway 20B requires less parts and is easier and less expensive to manufacture. Although less desirable, retainers 55 may be coupled to raceway 20B in various other fashions such as by being attached to raceway 20B.

Flange 56 generally comprises a member extending from rail 52 in a direction away from rail 54. Flange 56 generally provides a structure by which raceway 20B may be secured to vertical support structure 12B. In the particular embodiment illustrated, flange 56 includes a plurality of openings 70 (shown in FIGS. 5A–5C) for fastening raceway 20B to vertical support unit 12B. In addition, flange 56 provides a base from which supports 58 extend. Although flange 56 is illustrated as extending along the entire longitudinal length of raceway 20B, flange 56 may alternatively be provided by a plurality of structures extending outwardly from rail 52.

Supports 58 extend from flange 56 at a plurality of spaced locations along the longitudinal length of raceway 20B. Supports 58 are configured to separate individual power cables passing between adjacent supports 58 and to provide a structure to which the individual cables may be tied or otherwise secured. In the particular embodiment illustrated, supports 58 comprise wire extensions secured to and extending from flange 56. In the particular embodiment illustrated, each support comprises a one-quarter inch steel dowel coupled to flange 56 by welding, tapping or screwing. In one embodiment, holes are drilled and tapped at one U intervals along flange 56 (and flange 86) to accommodate variable spacing of supports 58 (and supports 88). In alternative embodiments, supports 58 may comprise other structures attached to flange 56 or may be integrally formed with flange 56. Supports 58 (like supports 88 described hereafter) are spaced at two U intervals. Such interval spacing may be modified depending upon the characteristics of the cabling contained within the channel.

Raceway 22A generally includes floor 80, rail 82, rail 84, retainers 85, flange 86 and supports 88. Floor 80, rail 82, retainers 85, flange 86 and supports 88 are substantially identical to floor 50, rail 52, retainers 55, flange 56 and supports 58 of raceway 20B, respectively. Similar to floor 50, floor 80 includes openings 90. Openings 90 are configured to permit the passage of communication, network or data cabling through floor 80. In the particular embodiment illustrated, openings 90 are also configured to permit the passage of a connector such as a conventionally known RG-45 connector head.

Rail 82 is substantially identical to rail 52. In particular, rail 82 includes openings 92 which are substantially identical to openings 62. Like openings 90, openings 92 are configured to allow the passage of communication, data or network cabling. In the particular embodiment illustrated, openings 92 are configured to additionally allow the passage of a connector head such as an RG-45 connector head. Rail 82 cooperates with floor 80 and rail 84 to form a channel 94 configured to receive a bundle of communication, data or network cables. In the particular embodiment illustrated, channel 94 is configured to receive a bundle (nominally eight) of conventionally known CAT-5 cables.

Openings 92 and channel 64 are each sized and configured substantially identical to openings 62 and channel 64, respectively. However, depending upon the size and configuration of the communication, data or network cabling, as well as the connector heads, the size and configuration of openings 90, openings 92 and channel 94 may be varied.

Rail 84 extends from floor 80 opposite rail 82. Rail 84 is configured to be releasably coupled to rail 54 of raceway 20B. In the particular embodiment illustrated, rail 84 has an elongate edge portion 98 configured to be nested within the elongate channel provided by coupling portion 68 of rail 54.

Retainers 85 are substantially identical to retainers 55. Retainers 85 are secured to retainers 55 by fasteners 99 (shown in FIGS. 5a–5c). Retainers 55 and 85 couple raceways 20B and 22A together and prevent dislodgment of edge portion 98 from the channel provided by coupling portion 68.

Although raceway 20B and 22A are illustrated as being releasably coupled to one another by retainers 55, 85 and fasteners 99, various other conventionally known or future developed mechanisms may be employed for releasably coupling raceways 20B and 22A together. Such coupling mechanisms may comprise interlocking structures, latches, snaps and the like. In lieu of utilizing fasteners 99, retainers 55 and 85 may alternatively be configured to releasably interlock with one another. Depending upon the nature of retainers 55 and 85, coupling portion 68 of rail 54 may be omitted in some applications.

In addition to forming channels 64 and 94 for the reception of cabling, rails 54 and 84 further cooperate to form a substantially imperforate divider 100 extending between rails 52 and 82 and between channels 64 and 94. Divider 100 has a longitudinal length that extends substantially along the entire longitudinal length of raceways 20B and 22A. In the particular embodiment illustrated, divider 100 faces rails 52 and 82 while extending generally perpendicular relative to floors 50 and 80. Divider 100 has a height equal to or greater than the height of both rails 52 and 54. Divider 100 is made of a material and has a sufficient thickness so as to substantially impede the transmission of electromagnetic waves across divider 100 which cause electromagnetic interference (EMI) in the communication cabling. In the particular embodiment illustrated, divider 100 has a height of approximately 7 inches. Each of rails 54 and 84 are formed from sheet metal having a thickness of approximately 0.01 inches with the paint coating on both sides of the rail increasing its thickness to approximately 0.02 inches. When rails 54 and 84 are coupled to one another, divider 100 has an overall thickness of approximately 0.04 inches.

Overall, divider 100 enables power cabling and communication, network or data cabling to be run within channels 64 and 94 that are in close proximity to one another without experiencing substantial EMI interference problems. As a result, system 11B may be placed in close proximity to systems 11A and 11C, preserving valuable space.

FIGS. 2–4 illustrate one exemplary embodiment of multi-channel raceway system 24. In alternative embodiments, raceways 20B and 22A may be permanently coupled to one another. In alternative embodiments, floors 50, 80, rails 52, 82 and rails 54, 84 may be integrally formed as a single unitary body. In lieu of divider 100 being formed by two rails which are coupled to one another, divider 100 may be provided by either rail 54 or rail 84, eliminating the need for the other intermediate rail. Although both rails 54 and 84 are illustrated as being substantially imperforate along the entire longitudinal length of system 24, one or both of rails 54 and 84 may alternatively be perforate, wherein rails 54 and 84, when coupled to one another, form a divider that is substantially imperforate along the entire longitudinal length of multi-channel raceway system 24. In alternative embodiments, rail 54 may extend along only a portion of raceway 20B while rail 84 extends along only a portion of raceway 22A, wherein rails 54 and 84, when coupled to one another, collectively extend along substantially the entire longitudinal length of system 24.

Figure 5A:
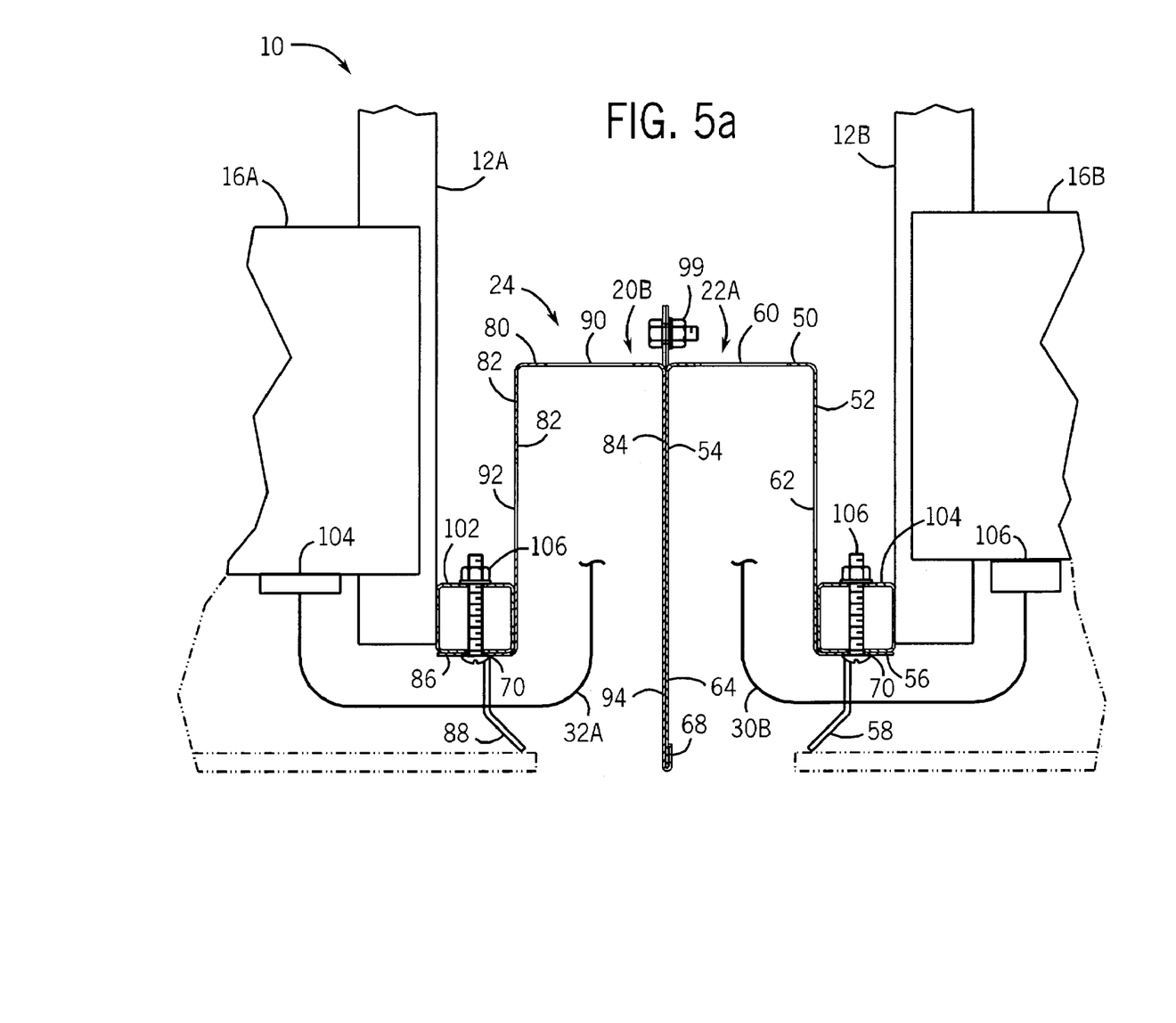
FIG. 5a is a fragmentary sectional view of the component cabling system of FIG. 1.
Figure 5B:
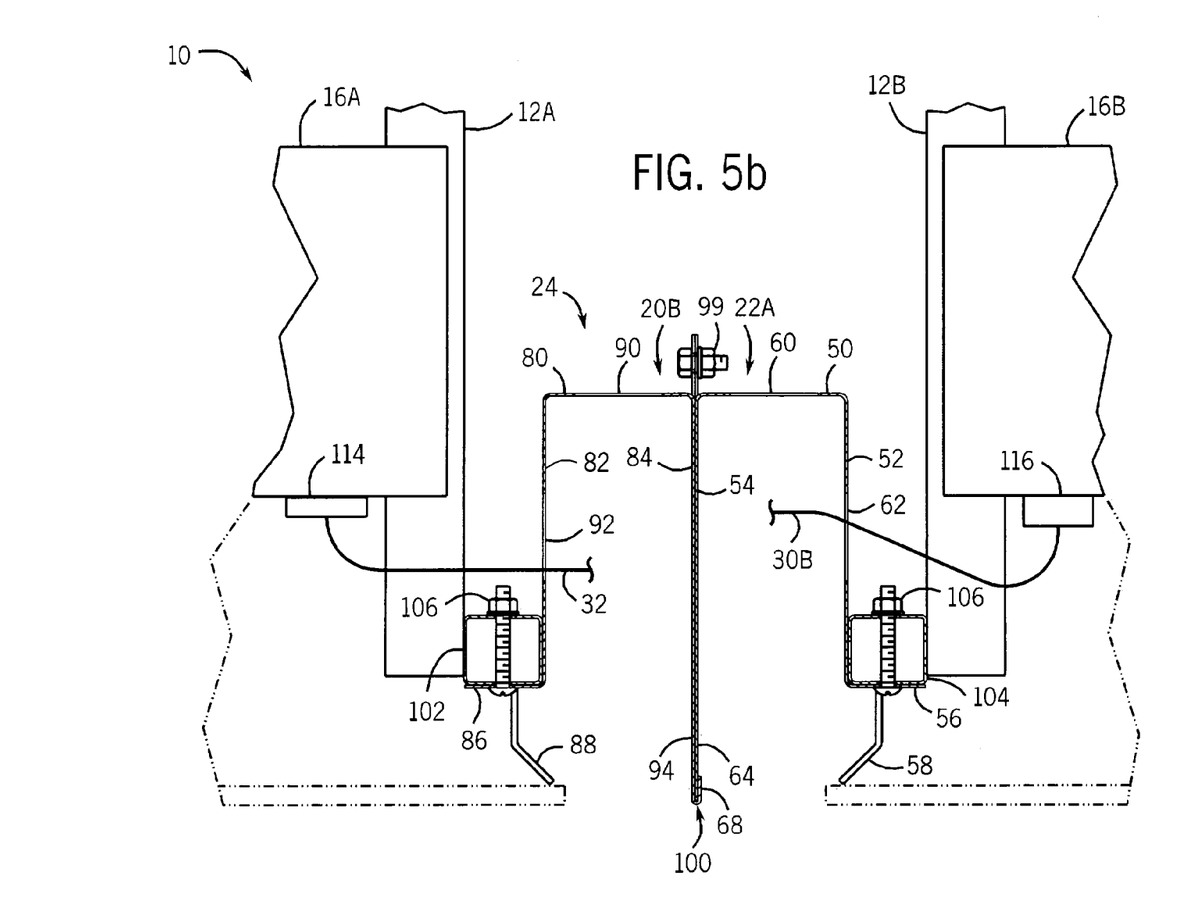
FIG. 5b is a fragmentary sectional view of a first alternative embodiment of the component cabling system of FIG. 1.
Figure 5C:
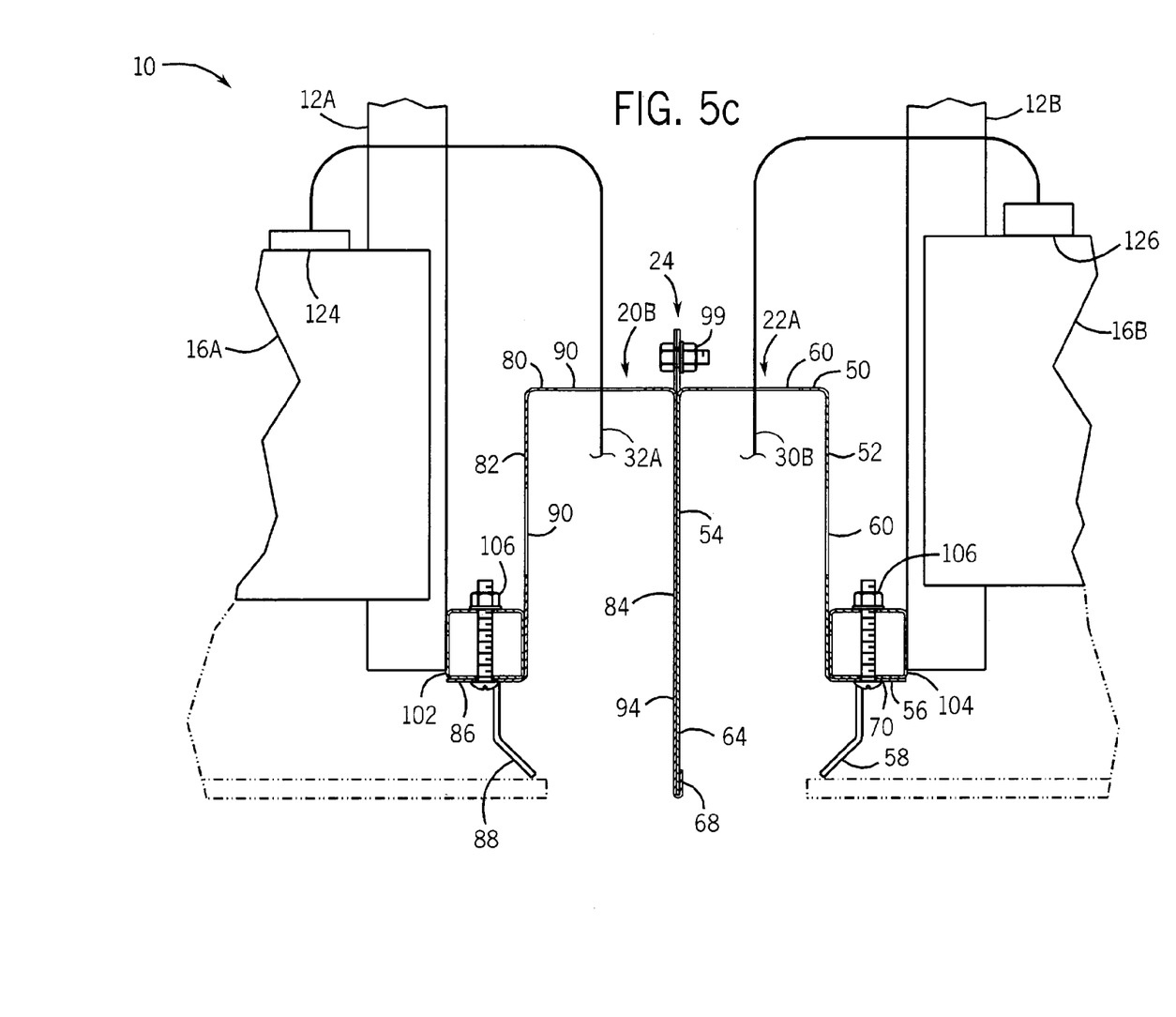
FIG. 5c is a fragmentary sectional view of a second alternative embodiment of the component cabling system of FIG. 1.

FIGS. 5a–5c illustrate system 10 (shown in FIG. 1) in greater detail. As best shown by FIGS. 5a–5c, multi-channel raceway system 24 is secured to the rearward corner posts 102 and 104 of vertical support units 12A and 12B, respectively. In the particular embodiment illustrated, fasteners 106 extend through openings 70 within each of flanges 56 and 86 and into engagement with corner posts 102 and 104. In alternative embodiments, flanges 56 and 86 may be positioned along front corner posts of adjacent vertical support units 12A and 12B. In still other embodiments, flanges 56 and 86 may be omitted wherein rails 52 and 82 are directly coupled to vertical support units 12B and 12A, respectively.

As best shown by FIGS. 5a–5c, flanges 56 and 86 bend around and overlap the front surface of the corners of vertical support units 12A and 12B, respectively. As a result, system 24 may be secured to vertical support units 12A and 12B utilizing fasteners 106 that extend generally parallel to divider 100. As a result, fasteners 106 do not project into channels 64 and 94, conserving the volume of channels 64 and 94 for the receipt of cabling. In addition, system 24 may be compactly positioned between adjacent vertical support units.

Moreover, flanges 56 and 86 further enable system 24 to accommodate vertical support units that have upper and lower portions with different widths. For example, in some systems, vertical support units 12A and 12B have a lower or base portion that is one-half inch wider than the upper portion on each side of the vertical support unit. Because flanges 56 and 86 overlap the corners of adjacent vertical support units and are connected to adjacent vertical support units, the degree or extent by which flanges 56 and 86 overlap the corners of the vertical support units may be varied to accommodate the different upper and lower dimensions of the vertical support units. When utilized with vertical support units that are half an inch wider at the top than at the bottom, flanges 56 and 58 overlap the corner posts of adjacent vertical support units by a half an inch less at the top as compared to the bottom.

FIGS. 5a–5c further illustrate the use of system 24 with different components having differently located connection points. FIG. 5a illustrates system 24 employed with components 16A and 16B that have a rearwardly located data connecting point 104 and rearwardly located power connecting point 106, respectively. In particular, power cabling 30B extends along channel 64 to a vertical location across from a particular component 16B. One of the power cables 30B is strung between supports 58 and across flange 56 to connection point 106. Although not illustrated, power cable 30B is preferably tied to support 58.

Communication cabling 32A extends along channel 94 to a vertical location across from one of components 16A. One or more communication cables 32A is strung between supports 88 across flange 86 to connection point 104 of component 16A. Communication cabling 32A is also tied to support 88.

FIG. 5b illustrates system 24 employed with components 16A and 16B having intermediate communication and power connection points 114 and 116, respectively. In particular, components 16A and 16B either have dimensions or are located upon vertical support units 12A and 12B, respectively, such that communication connection point 114 and power connection point 116 are located closer to the middle of the vertical support unit as compared to the arrangement shown in FIG. 5a. In such an arrangement, power cabling 30B extends along channel 64 to a vertical location across from component 16B. Power cabling 30 passes through opening 62 within rail 52 to connect to connection point 116. Communication cabling 32A extends along channel 94 to a vertical location substantially across from one of components 16A. Cabling 32A passes through opening 92 within rail 82 to be connected to connection point 114.

FIG. 5c illustrates system 24 utilized with components 16A and 16B that have frontward communication and power connection points 124 and 126, respectively. In such an arrangement, power cabling 30B extends along and within channel 64 to a vertical location substantially across from component 16B. Power cabling 30B passes through opening 60 within floor 50 to connect to frontward connection point 126. Similarly, communication cabling 32A extends along channel 94 to a vertical location substantially across from component 16A. Communication cabling 32A passes through opening 90 of floor 80 to connect to frontward connection point 124 of component 16A.

FIGS. 5a–5c illustrate but a few various arrangements in which system 24 may be utilized. System 24 enables cabling 32A and 30B to be easily connected to components 16A and 16B regardless of whether component 16A has a rearward, frontward or intermediate connection point and regardless of whether component 16B has a rearward, frontward or intermediate connection point. Although less desirable, any one of openings 60, 90, 62 or 92 may be omitted from their respective floors or rails. Furthermore, supports 58, 88 may also be omitted in particular applications.

Figure 6:
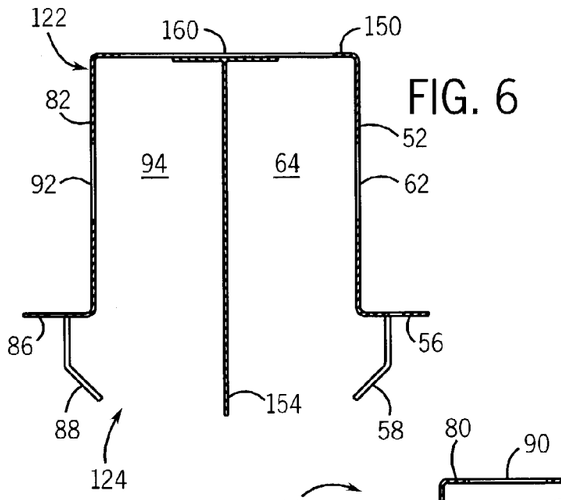
FIG. 6 is a sectional view of a first alternative embodiment of the multi-channel raceway system shown in FIGS. 2–4.
Figure 7:
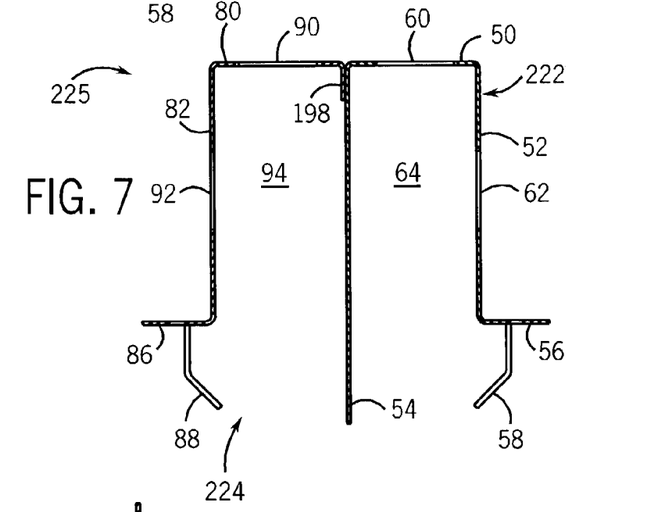
FIG. 7 is a sectional view of a second alternative embodiment of the multi-channel raceway system shown in FIGS. 2–4.
Figure 8:
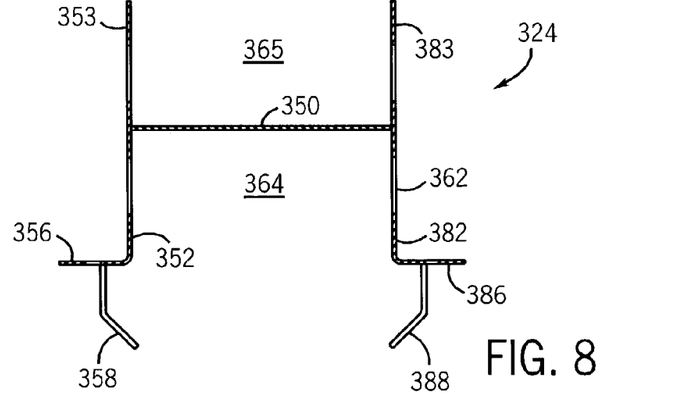
FIG. 8 is a sectional view of a third alternative embodiment of the multi-channel raceway system of FIGS. 2–4.

FIGS. 6–8 are sectional views illustrating alternative embodiments of multi-channel raceway system 24. Raceway system 124 is similar to raceway system 24 except that system 124 includes floor 150 in lieu of floor 50 and includes rail 154 in lieu of rails 52 and 54. Those remaining components of system 124 which are substantially identical to system 24 are numbered similarly. Floor 150 comprises a single floor from which both rails 52 and 82 extend. Floor 150 includes a plurality of spaced openings 160 extending along substantially the entire longitudinal length of system 124. Openings 160 are configured such that openings 160 extend on both sides of rail 154 and enable cabling to pass through openings 160 on each side of rail 154. In alternative embodiments, floor 150 may include distinct openings on each side of rail 154 to enable cabling to pass therethrough. Openings 160 enable cabling to pass through floor 150 enabling connection to components having connecting points distant from flanges 56 and 96. Although less desirable, openings 160 may be omitted.

Rail 154 is releasably coupled to floor 150 and serves as a divider so as to form channels 64 and 94. In the particular embodiment illustrated, rail 154 extends along substantially the entire longitudinal length of system 124. Rail 154 is formed from one or more chosen materials and is sufficiently thick so as to block the passage of EMI between channels 64 and 94. Rail 154 may be releasably coupled to floor 150 by various conventionally known or future developed releasable connection mechanisms. For example, floor 150 and rail 154 may have complementary releasable interlocking structures. Alternatively, rail 154 may be secured to floor 150 by releasable fasteners and the like. Because rail 154 is releasably coupled to floor 150, rail 154 may be provided as an add-on to existing single channel raceways, such as the raceway 120 formed by floor 150 and rails 52, 82, or may be removed to convert a multi-channel raceway into a single channel raceway having a greater volume.

FIG. 7 illustrates system 224, an alternative embodiment of system 24. System 224 is similar to system 24 except that system 224 omits rail 54 and alternatively includes mounting portion 198. Those remaining components of system 224 which correspond to components of system 24 are numbered similarly. Mounting portion 198 is coupled to floor 80 and is configured to releasably couple floor 80 to one or both of floor 50 and rail 52. In one embodiment, mounting portion 198 is configured to releasably interlock with a portion of rail 52. In another embodiment, system 24 employs a releasable fastener extending through mounting portion 198 and rail 52. In other embodiments, mounting portion 198 may be omitted where other mechanisms are used to releasably couple floor 80 to either floor 50 or rail 52. In the embodiment shown in FIG. 7, rail 52 extends substantially along the entire length of system 224 while being made of a material with a sufficient thickness so as to substantially impede the passage of EMI between channels 64 and 94.

System 224 provides a multi-channel raceway system that may be converted to a single channel raceway. Alternatively, the add-on portion 225 consisting of at least floor 80 and rail 82 may be employed to convert existing single channel raceways, such as raceway 222 formed by floor 50 and rails 52, 54, into multi-channel raceway systems.

FIG. 8 illustrates system 324, a third alternative embodiment of system 24. System 324 generally includes floor 350, rails 352, 353, 382, 383, flanges 356, 386 and supports 358, 388. Floor 350 extends non-parallel to rails 352, 353, 382 and 383. In the particular embodiment illustrated, floor 350 extends perpendicular to rails 352, 353, 382, 383. Floor 350 intersects rails 352 and 353 and further intersects rails 382 and 383 to form channels 364 and 365. Channels 364 and 365 are configured to receive cabling such as power and communication cabling. Floor 350 acts as a divider extending substantially along the entire longitudinal length of system 324. Floor 350 is substantially imperforate while being formed of a material having a sufficient thickness such that floor 350 further blocks EMI waves or interference passing across floor 350 between channels 364 and 365.

Rails 352 and 353 are coupled to floor 350 and form one side of channels 364 and 365 while rails 382 and 383 are coupled to floor 50 and form an opposite side of channels 364 and 365. In the particular embodiment illustrated, each of rails 352, 353, 382 and 383 include at least one opening 362 configured to allow the passage of communication and/or power cabling therethrough for facilitating connection of the cabling to components. In the particular embodiment illustrated, openings 362 are also configured to permit the passage of the connector heads or ends of such cabling.

Flanges 356, 386 and supports 358, 388 are substantially identical to flanges 58, 88 and supports 56 and 86, respectively. Flanges 356 and 358 facilitate coupling of system 324 to a front or rear side of a vertical support unit. In alternative embodiments, flanges 356, 386 may be omitted where system 324 is mounted between vertical support units utilizing other mounting arrangements.

Although the present invention has been described with reference to preferred embodiments, workers skilled in the art will recognize that changes may be made in form and detail without departing from the spirit and scope of the invention. For example, although different preferred embodiments may have been described as including one or more features providing one or more benefits, it is contemplated that the described features may be interchanged with one another or alternatively be combined with one another in the described preferred embodiments or in other alternative embodiments. Moreover, each of the features may be employed independent of the other features. Because the technology of the present invention is relatively complex, not all changes in the technology are foreseeable. The present invention described with reference to the preferred embodiments and set forth in the following claims is manifestly intended to be as broad as possible. For example, unless specifically otherwise noted, the claims reciting a single particular element also encompass a plurality of such particular elements.

What is claimed is:

1. A raceway system for use with a vertical support unit, the system comprising:
   at least one floor having a first total longitudinal length;
   a first rail extending from the at least one floor, wherein the first rail has mounting portion distant the at least one floor and configured to be mounted to the vertical support unit;
   a second rail extending from the at least one floor;
   at least one substantially imperforate divider extending from the at least one floor and between the first rail and the second rail, wherein the divider has a second longitudinal length no less than the first longitudinal length, wherein the at least one floor, the first rail and the at least one divider form a first channel having a first continuous access gap opposite the at least one floor, having a third longitudinal length no less than the first longitudinal length, and configured to enable cabling to be inserted into the first channel in a direction nonparallel to the floor and wherein the at least one floor, the second rail and the at least one divider form a second channel having a second continuous access gap opposite the at least one floor. having a fourth longitudinal length no less than the first longitudinal length, and configured to enable cabling to be inserted into the second channel in a direction nonparallel to the floor; and
   a first flange extending substantially parallel to the at least one floor and spaced from the at least one floor in a direction substantially perpendicular to the at least one floor, coupled to the first rail and extending outwardly from the first rail away from the at least one divider.

2. The system of claim 1, wherein the first rail has a first height and wherein the divider has a second height no less than the first height.

3. The System of claim 1, wherein the at least one floor includes:
   a first floor; and
   a second floor removably coupled to the first floor.

4. The system of claim 3, wherein the divider includes a third rail extending from at least one of the first floor and the second floor.

5. The system of claim 3, wherein the divider includes a third rail extending from the first floor and a fourth rail extending from the second floor.

6. The system of claim 5, wherein the third rail and the fourth rail are removably coupled to one another.

7. The system of claim 5, wherein the third rail and the fourth rail mate with one another.

8. The system of claim 7, wherein the third rail at least partially nests within the fourth rail.

9. The system of claim 8 including a fastener releasably retaining the third rail and the fourth rail in a nested state.

10. The system of claim 1, wherein the first flange is adapted to overlie at least a front or rear surface of the vertical support unit.

11. The system of claim 10 including at least one fastener coupled to the first flange and adapted to join the first flange to the vertical support unit.

12. The system of claim 1 including a plurality of supports extending from the first flange, the plurality of supports including a first support, a second support and a third support between the first support and the second support, wherein the third support is configured to separate individual cables passing between the first and third supports and between the second and third supports.

13. The system of claim 12, wherein the plurality of supports extends towards the divider.

14. The system of claim 1, wherein the first flange extends substantially perpendicular to the first rail.

15. The system of claim 1, wherein the at least one floor is perforate.

16. The system of claim 15, wherein the at least one floor includes at least one opening configured to permit passage of standard communication or power cabling therethrough.

17. The system of claim 15, wherein the at least one floor includes at least one opening configured to permit passage of a power cabling connector head therethrough.

18. The system of claim 1, wherein the at least one floor includes at least one opening and wherein the at least one opening extends substantially along a majority of the first longitudinal length of the at least one floor.

19. The system of claim 1, wherein the at least one floor includes at least one first opening on a first side of the divider and at least one second opening on a second side of the divider.

20. The system of claim 1, wherein at least one of the first rail and the second rail is perforate.

21. The system of claim 1, wherein at least one of the first rail and the second rail includes at least one opening configured to permit passage of standard communication or power cabling therethrough.

22. The system of claim 20, wherein at least one of the first rail and the second rail includes at least one opening configured to permit passage of a standard power cabling IEC C13 connector head therethrough.

23. The system of claim 1, wherein at least one of the first rail and the second rail includes at least one opening extending therethrough and wherein the at least one opening extends substantially along a majority of the first longitudinal length of the at least one floor.

24. The system of claim 1, wherein at least one of the first rail and the second rail includes at least one rail opening configured to permit passage of standard communication or power cabling therethrough and wherein at least one floor includes at least one floor opening configured to permit passage of standard communication or power cabling therethrough.

25. The system of claim 1, wherein the first rail and the second rail each include at least one opening configured to permit passage of standard communication or power cabling therethrough.

26. The system of claim 1, wherein the first rail extends above the at feast one floor by a height of at least about 5 inches.

27. The system of claim 1, wherein the at least one divider extends above the at least one floor by a height of at least about 7 inches.

28. The system of claim 1, wherein the at least one floor, the first rail and the second rail are formed from deformed sheet metal.

29. The system of claim 1, wherein the at least one divider is configured to substantially block EMI.

30. The system of claim 1, wherein the at least one divider is removably coupled to the at feast one floor.

31. A raceway system for use with a vertical support unit, the system comprising:
a first floor;
a first rail extending from the first floor;
a second floor;
a second rail extending from the second floor, wherein the first floor and the second floor are removably coupled to one another independent of the vertical support unit;
at least one substantially imperforate divider coupled to at least one of the first floor and the second floor and extending between the first rail and the second rail; and
at least one opening through one of the first floor, the second floor, the first rail and the second rail, wherein the at least one opening is configured to permit passage of standard communication or power cabling therethrough. wherein the divider includes a third rail extending from at least one of the first floor and the second floor.

32. The system of claim 31, wherein the a third rail extends from the first floor and wherein the divider further includes a fourth rail extending from the second floor substantially parallel to the first rail and the second rail.

33. A component support system comprising:
a first vertical support unit having a first side, a second side spaced from the first side, a third side, and a fourth side spaced from the third side and a first volume between the first side and the second side and between the third side and the fourth side, the first volume configured to contain a first plurality of computing or network components in a vertically arranged relationship while the first unit supports the first plurality of components, the first vertical support unit having a first vertical corner having a first surface, wherein the components are selected from a group of components consisting of: routers, switches, servers, and computer drives:
a second vertical support unit having a fifth side, a sixth side spaced from the fifth side, a seventh side, and a eighth side spaced from the seventh side and a second volume between the fifth side and the sixth side and between the seventh side and the eighth side, the second volume configured to contain a second plurality of computing or network components in a vertically arranged relationship while the second unit supports the second plurality of components, the second vertical support unit having a second vertical corner having a second surface facing the first surface; and
a raceway system having channels sandwiched between the first side and the first surface of first vertical support unit and the fifth side and the second surface of the second vertical support unit so as to space the first corner from the second corner, the raceway system including:
at least one floor; and
at least one divider coupled to the at least one floor and extending non-parallel relative to the at least one floor, wherein the at least one divider extends parallel to the first surface and the second surface.

34. The system of claim 33, wherein the raceway system is removably coupled to at least one of the first vertical support unit and the second vertical support unit.

35. The system of claim 33, wherein the first vertical support unit includes at least one third surface facing the divider, wherein the third surface, the at least one floor and the divider form one of the channels.

36. The system of claim 33, wherein the at least one floor includes a first floor and a second floor and wherein the first floor and the second floor are removably coupled to one another.

37. The system of claim 33, wherein the at least one floor has a first longitudinal length and wherein the at least one divider has a second longitudinal length no less than the first longitudinal length.

38. A component support system comprising:
a first vertical support unit having four vertical corners and configured to support a first plurality of computing or network components in a vertically arranged relationship between the four corners of the first unit, the first unit having a first surface;
a second vertical support unit having four vertical corners and configured to support a second plurality of computing or network components in a vertically arranged relationship between the four corners of the second unit, the second unit having a second surface facing the first surface;
means for providing at least two cable receiving U-shaped channels facing in a common direction parallel to the first surface and the second surface and sandwiched between the first surface of the first vertical support unit and the second surface of the second vertical support unit; and
means for preventing electromagnetic interference from passing between the at least two cable receiving channels.

39. A component cabling system comprising:
a first vertical support unit;
at least one first component supported by the first vertical support unit;
a second vertical support unit;
at least one second component supported by the second vertical support unit;
a raceway system between the first vertical support unit and the second vertical support unit, the raceway system being configured to provide a plurality of channels separated by at least one divider, the plurality of channels including a first channel and a second channel;
at least one communication cabling extending in the first channel and coupled to the at least one first component; and
at least one power cabling extending in the second channel and coupled to the at least one second component, wherein the at least one divider segregates the at least one communication cabling from the at least one power cabling and wherein at least one of the communication cabling and the power cabling extends through a floor of one of the first channel and of the second channel, the floor being substantially perpendicular to the divider and opposite a continuous access gap so as to face in a direction parallel to the floor and through the access gap.

40. The system of claim 39, wherein the raceway system includes:
at least one first rail; and
at least one second rail opposite the at least one first rail, wherein the at least one divider extends between the at least one first rail and the at least one second rail.

41. The system of claim 40, wherein the at least one divider interconnects the at least one first rail and the at least one second rail.

42. The system of claim 40, wherein the floor interconnects the at least one first rail and the at least one second rail and wherein the at least one divider extends from the floor.

43. A raceway system for use with a vertical support unit having four vertical corners and configured to support a plurality of computing or network components in a vertically arranged relationship between the four corners of the unit, the system comprising:
at least one floor having a first longitudinal end and a second longitudinal end;
a first rail extending from the at least one floor continuously from the first end to the second end;
a second rail extending from the at least one floor continuously from the first end to the second end, wherein at least one of the first rail and the second rail includes at least one opening configured to permit passage of a standard power cabling IEC C13 connector head therethrough; and
at least one substantially imperforate divider extending between the first rail and the second rail and substantially parallel to the first rail and the second rail to form a first channel defined by the at least one floor, the first rail and the divider and having a first continuous access gap opposite the at least one floor from the first end to the second end and a second channel defined by the at least one floor, the second rail and the divider and having a second continuous access gap opposite the at least one floor from the first end to the second end, wherein the at least one floor, the first rail and the second rail are coupled to one another as a unit independent or the vertical support unit and wherein at least one of the first rail and the second rail includes at least one opening configured to permit passage of at least one of a communication cabling or a power cabling therethrough.

44. The system of claim 33, wherein the raceway system wraps around the first corner and wraps around the second corner.

45. A raceway system for use with a vertical support unit, the system comprising:
a first floor;
a first rail extending from the first floor;
a second floor;
a second rail extending from the second floor, wherein the first floor and the second floor are removably coupled to one another independent of the vertical support unit; and
a substantially imperforate divider extending between the first rail and the second rail, wherein the divider includes a third rail extending from the first floor and a fourth rail extending from the second floor, wherein the first floor, the first rail and the third rail are integrally formed as a single unitary body and wherein the second floor, the second rail and the fourth rail are integrally formed as a single unitary body.

46. A raceway system for use with a vertical support unit configured to support a plurality of computing or network components in vertically arranged relationship, the system comprising:
a first floor having a total longitudinal length;
a first rail extending from the first floor;
a second floor;
a second rail extending from the second floor; and
at least one substantially imperforate divider extending from at feast one of the first floor and the second floor and extending between the first rail and the second rail, wherein the first floor, the first rail and the at least one divider form a first channel having a first access gap opposite the first floor, wherein the second floor, the second rail and the at least one divider form a second channel having a second access gap opposite the second floor, wherein the first floor and the second floor are removably coupled to one another independent of the vertical support unit by at least one fastener external to both the first channel and the second channel.

47. A raceway system comprising:
a first floor;
a first rail extending from first floor;
a second rail extending from the first floor, wherein the first floor, the first rail and the second rail are integrally formed as part of a first single piece U-shaped unitary body having a first access gap opposite the first floor;
a second floor;
a third rail extending from the second floor;
a fourth rail extending from the second floor, wherein the second floor, the third rail and the fourth rail are integrally formed as a second single piece U-shaped unitary body having a second access gap opposite in the second floor and wherein the third rail and the second rail are releasably coupled to one another to form a single member having a first channel configured to receive power cabling and a second channel configured to receive standard communication cabling, wherein the first access gap and the second access gap open in a same direction perpendicular to the first floor and the second floor.

48. The system of claim 47 including a first flange extending from the first rail away from the second rail and configured to be mounted to a corner of a first vertical support unit such that the first flange extends along a first side of the first corner and the first rail extends along a second side of the first corner.

49. The system of claim 48 including a second flange extending from the fourth rail away from the third rail and configured to a second corner of a second vertical support unit such that the second flange extends along a first side or the second corner and the fourth rail extends along a second side of the second corner.

50. The system of claim 47 including:
a first opening extending through the first rail and configured to permit the passage of power cabling therethrough; and
a second opening extending through the fourth rail and configured to permit passage of communication cabling therethrough.

51. The system of claim 16, wherein the at least one opening comprises a completely bounded longitudinally extending slot.

52. The system of claim 33, wherein the raceway system is proximate the first side and wherein the channels face in a direction away from the second side.

53. The system of claim 33, wherein each of the channels have at least one open axial end.

54. A raceway system for use with a vertical support unit, the system comprising:
at least one floor having a first total longitudinal length, wherein the at least one floor includes;
a first floor; and
a second floor removably coupled to the first floor;
a first rail extending from the at least one floor, wherein the first rail has mounting portion distant the at least one floor and configured to be mounted to the vertical support unit;
a second rail extending from the at least one floor; and
at least one substantially imperforate divider extending from the at least one floor and between the first rail and the second rail, wherein the divider has a second longitudinal length no less than the first longitudinal length, wherein the at least one floor, the first rail and the at least one divider form a first channel having a first continuous access gap opposite the at least one floor, having a third longitudinal length no less than the first longitudinal length, and configured to enable cabling to be inserted into the first channel in a direction nonparallel to the floor and wherein the at least one floor, the second rail and the at least one divider form a second channel having a second continuous access gap opposite the at least one floor, having a fourth longitudinal length no less than the first longitudinal length, and configured to enable cabling to be inserted into the second channel in a direction nonparallel to the floor.

55. A raceway system for use with a vertical support unit, the system comprising:
at least one floor having a first total longitudinal length;
a first rail extending from the at least one floor, wherein the first rail has mounting portion distant the at least one floor and configured to be mounted to the vertical support unit;
a second rail extending from the at least one floor, wherein at least one of the first rail and the second rail includes at least one opening configured to permit passage of standard communication or power cabling therethrough and wherein the at least one opening comprises a completely bounded longitudinally extending slot; and
at least one substantially imperforate divider extending from the at least one floor and between the first rail and the second rail, wherein the divider has a second longitudinal length no less than the first longitudinal length, wherein the at least one floor, the first rail and the at least one divider form a first channel having a first continuous access gap opposite the at least one floor, having a third longitudinal length no less than the first longitudinal length, and configured to enable cabling to be inserted into the first channel in a direction nonparallel to the floor and wherein the at least one floor, the second rail and the at least one divider form a second channel having a second continuous access gap opposite the at least one floor, having a fourth longitudinal length no less than the first longitudinal length, and configured to enable cabling to be inserted into the second channel in a direction nonparallel to the floor.

56. The system of claim 33, wherein the at least one floor extends opposite a continuous access gap and includes at least one opening configured to permit passage of standard communication or power cabling therethrough.

57. The system of claim 56 further comprising:
a first rail extending non-parallel from the at least one floor;
a second rail extending non-parallel from the at least one floor, wherein at least one of the first rail and the second rail includes at least one opening configured to permit passage of standard communication or power cabling therethrough.

58. The system of claim 39, wherein the at least one first component and the at least one second component are selected from a group of components consisting of: routers, switches, servers, and computer drives.

59. The system of claim 39, wherein at least one of the power cabling and the communication cabling passes through an access gap opposite the floor.

60. The system of claim 43, wherein the at least one floor includes at least one opening configured to permit passage of standard communication or power cabling therethrough.

61. The system of claim 47, wherein at least one of the first floor and the second floor includes at least one opening configured to permit passage of standard communication or power cabling therethrough.

62. A component support system comprising:
a first vertical support unit having a first side, a second side spaced from the first side, a third side, and a fourth side spaced from the third side and a first volume between the first side and the second side and between the third side and the fourth side, the first volume configured to contain a first plurality of computing or network components in a vertically arranged relationship while the first unit supports the first plurality of components, the first vertical support unit having a first vertical corner having a first surface;
a second vertical support unit having a fifth side, a sixth side spaced from the fifth side, a seventh side, and a eighth side spaced from the seventh side and a second volume between the fifth side and the sixth side and between the seventh side and the eighth side, the second volume configured to contain a second plurality of computing or network components in a vertically arranged relationship while the second unit supports the second plurality of components, the second vertical support unit having a second vertical corner having a second surface facing the first surface; and
a raceway system having channels sandwiched between the first side and the first surface of first vertical support unit and the fifth side and the second surface of the second vertical support unit so as to space the first corner from the second corner, the raceway system including:

at least one floor; and at least one divider coupled to the at least one floor and extending non-parallel relative to the at least one floor, wherein the at least one divider extends parallel to the first surface and the second surface, wherein the at least one floor Includes a first floor and a second floor and wherein the first floor and the second floor are removably coupled to one another.

\* \* \* \* \*

UNITED STATES PATENT AND TRADEMARK OFFICE
CERTIFICATE OF CORRECTION

PATENT NO. : 7,229,050 B2  
APPLICATION NO. : 10/306132  
DATED : June 12, 2007  
INVENTOR(S) : Rheid J. Schloss It is certified that error appears in the above-identified patent and that said Letters Patent is hereby corrected as shown below:

In column 12, line 3, in Claim 1, after "floor" delete "." and insert -- , --, therefor.

In column 12, line 16, in Claim 3, delete "System" and insert -- system --, therefor.

In column 13, line 28, in Claim 26, delete "feast" and insert -- least --, therefor.

In column 13, line 39, in Claim 30, delete "feast" and insert -- least --, therefor.

In column 13, lines 54-55, in Claim 31, after "therethrough" delete "." and insert -- , --, therefor.

In column 13, line 58, in Claim 32, after "the" delete "a".

In column 15, line 66, in Claim 43, delete "or the" and insert -- of the --, therefor.

In column 17, line 6, in Claim 49, after "side" delete "or" and insert -- of --, therefor.

In column 17, line 27, in Claim 54, after "includes" delete ";" and insert -- : --, therefor.

Signed and Sealed this

Nineteenth Day of August, 2008

JON W. DUDAS  
*Director of the United States Patent and Trademark Office*